United States Patent [19]

Nozaki

[11] Patent Number: 4,807,160

[45] Date of Patent: Feb. 21, 1989

[54] METHOD OF TESTING RIGGED DISTRIBUTING CABLE FOR TRAIN MONITOR

[75] Inventor: Yasutaka Nozaki, Hyogo, Japan

[73] Assignee: Mitsubishi Denki Kabushiki Kaisha, Tokyo, Japan

[21] Appl. No.: 893,646

[22] Filed: Aug. 6, 1986

[30] Foreign Application Priority Data

Oct. 11, 1985 [JP] Japan .................................. 60-227229

[51] Int. Cl.⁴ ............................................ G01R 31/02
[52] U.S. Cl. .................................... 364/550; 324/503; 324/538
[58] Field of Search ............... 324/503, 527, 537, 538, 324/555; 364/481, 550; 371/15, 25

[56] References Cited

U.S. PATENT DOCUMENTS

| | | | |
|---|---|---|---|
| Re. 31,056 | 10/1982 | Chau et al. ........................ | 371/25 X |
| 3,182,253 | 5/1965 | Dorsch et al. ................... | 324/538 X |
| 3,559,051 | 1/1971 | Mazurek ............................. | 324/538 |
| 3,986,106 | 10/1976 | Schuck et al. ................... | 324/538 X |
| 4,041,455 | 8/1977 | Norberg ................................ | 371/15 |
| 4,114,091 | 9/1978 | Howard ........................... | 324/538 X |
| 4,263,550 | 4/1981 | Schweitzer, Jr. ............... | 324/538 X |

FOREIGN PATENT DOCUMENTS 61-22701 1/1986 Japan .

Primary Examiner—Parshotam S. Lall
Assistant Examiner—Edward R. Cosimono
Attorney, Agent, or Firm—Bernard, Rothwell & Brown

[57] ABSTRACT

A method of testing electrical continuity and so forth of distributing cables which are rigged in a plurality of mutually coupled vehicles of an electric, diesel or steam railroad train for electrically connecting monitored apparatus in the vehicles to monitors installed for watching and checking such monitored apparatus. The method comprises a first step of connecting at least one display means in common to the monitors installed in the train vehicles, a second step of disconnecting a connector from each distributing cable adjacent to the monitored apparatus and connecting the connector to a tester, a third step of feeding from the tester to each of the monitors a testing signal electrically equivalent to the output signal of the monitored apparatus, and a fourth step of displaying the information, which corresponds to the state of the distributing cable, on the display means via the monitor, thereby testing the cable with respect to the presence or absence of any abnormality such as breaking or deterioration.

10 Claims, 2 Drawing Sheets

METHOD OF TESTING RIGGED DISTRIBUTING CABLE FOR TRAIN MONITOR

BACKGROUND OF THE INVENTION

1. Field of the Invention

The present invention relates to a method of testing a distributing cable rigged for electrically connecting a controller (hereinafter referred to as monitored apparatus) which functions for various equipments installed in each vehicle of a railroad train with an electric, diesel or steam locomotive, to a train monitor used for watching and checking such monitored apparatus.

2. Description of the Prior Art

Generally in an electric, diesel or steam railroad train constituted by mutually coupling a plurality of vehicles by means of couplers, it is customary that monitors are provided for monitoring from a motorman's cab or conductor's compartment the operating state of various equipments installed in the vehicles, such as drive means for running the train, brake means for stopping the same, control means (of relatively great importance including hydraulic pump, transmission and so forth) for controlling drivers and actuators for the equipments and, in the case of a passenger train, some auxiliary means such as floodlights, air conditioners, automatic doors and so forth furnished to ensure comfortable ride for passengers. Such monitors and the various monitored apparatus are connected with each other by distributing cables rigged under the floor of each vehicle or on the ceiling thereof. In the prior examples suited to facilitate understanding of the entire constitution of such train monitors, there is known "Train Monitor" disclosed in Japanese Patent Laid-open No. 61 (1986) - 22701 (inventor: Hidehisa Homma).

Conventionally, the distributing cable rigged in each vehicle for the train monitor mentioned above is tested by the use of a tester as shown in FIG. 1, so as to check the presence or absence of any fault or abnormality such as breaking of the cable or electric leakage. First the structure and arrangement of such tester will be described below. A monitor 1 provided for each vehicle and a monitored apparatus 2 to be checked by the monitor 1 are mutually connected by means of a distributing cable 3. The cable 3 is rigged under the floor of each train vehicle or on the ceiling thereof, and a connector 31 to be mated with a connector 11 of the monitor 1 is attached to one end of the distributing cable 3 adjacent to the monitor 1, while a connector 32 to be mated with a connector 21 of the monitored apparatus 2 is attached to another end of the cable 3 adjacent to the monitored apparatus 2. The tester 4 for checking the continuity and so forth of the distributing cable 3 has connectors 41, 42 to which a short testing cable 5 and a long testing cable 6 are connected through connectors 51, 61 attached respectively to ends of the cables 5 and 6 on one side thereof. Meanwhile, to the other ends of the testing cables 5, 6 are attached connectors 52, 62 which are to be mated with connectors 31, 32 attached to the two ends of the distributing cable 3.

The cable 3 rigged between the train monitor of such constitution and the monitored apparatus is tested by the tester 4 in the following procedure.

Normally the monitor 1 and the monitored apparatus 2 are electrically connected to each other through the distributing cable 3, and the operating state of the monitored apparatus 2 is transmitted in the form of electric signals to the monitor 1 so that the apparatus 2 can be checked by the monitor 1.

Since high reliability is required in the distributing cable 3 to ensure the proper function of the monitor 1, a test is conducted when necessary or periodically with respect to the characteristics thereof including electrical continuity. In conducting such a test, first the connectors 31, 32 attached to the two ends of the distributing cable 3 are separated from the connector 11 of the monitor 1 and the connector 21 of the monitored apparatus 2 respectively and, as indicated by dotted-line arrows, the connectors 31, 32 are fitted to connectors 52, 62 respectively at the fore ends of the testing cables 5, 6. Then a signal equivalent to the output of the monitored apparatus 2, e.g. an electric signal equivalent to a braking current in case the monitored apparatus is a brake, is transmitted from the tester 4 and returned thereto via the testing cable 6, the distributing cable 3 and the testing cable 5 as indicated by solid-line arrows. In this stage a display lamp composed of a light emitting diode 43 or the like and disposed in the tester 4 is turned on, blinked or turned off to ascertain the presence or absence of any fault such as breaking of the distributing cable 3.

However, there has been existent the following problem in the above-described conventional method of testing the distributing cable. First, in case the monitor 1 and the monitored apparatus 2 are installed in the front and rear of a single train vehicle, the distributing cable 3 rigged for the monitor 1 becomes considerably long, so that the testing cable 6 also needs to be sufficiently long to meet the requirement, hence raising the installation cost.

Furthermore, due to the necessity of lengthening the testing cable 6 or 5, the work of installing the tester 4 is rendered intricate to eventually cause extreme deterioration of the testing efficiency.

In addition, the longer testing cable 6 or 5 comes to increase the possibility of generating some fault such as breaking of the testing cable itself and, even when any abnormality is found by the tester, it is not obvious whether such abnormality is derived from the distributing cable 3 or the testing cable 6 or 5, thereby impairing the reliability on the test.

SUMMARY OF THE INVENTION

It is a first object of the present invention to provide an improved method of testing a rigged distributing cable by utilizing an existing monitor without the necessity of any long testing cable to consequently reduce the equipment cost.

A second object of the invention resides in providing an improved distributing-cable testing method which can be carried out with short testing cables to simplify the installation of a tester as well as to enhance the testing efficiency.

And a third object of the invention is to provide a high-reliability testing method which employs short testing cables to prevent any abnormality relative to the tester including the testing cables.

The method of this invention accomplished to achieve the above objects comprises the following steps in testing a distributing cable rigged for a train monitor to electrically connect the same to a monitored apparatus: a first step of connecting at least one display means to a monitor installed in each vehicle; a second step of disconnecting a connector of the distributing cable from the monitored apparatus and connecting it to a tester; a third step of feeding from the tester to the monitor a testing signal electrically equivalent to the output signal of the monitored apparatus; and a fourth step of displaying the information, which corresponds to the state of the rigged distributing cable, on a display means via the monitor.

Through the above steps executed for testing the distribution cable rigged between the monitored apparatus and the monitor in each vehicle of the railroad train, the information corresponding to the state of the distributing cable can be presented on the display means merely by connecting a tester to one end of the cable adjacent to the monitored apparatus and feeding a testing signal, which is equivalent to the output signal of the monitored apparatus, from the tester via the distributing cable to the monitor, thereby checking the electrical continuity of the cable while detecting any deterioration or breaking thereof.

DETAILED DESCRIPTION OF THE PREFERRED EMBODIMENT

Hereinafter a preferred embodiment designed for carrying out the train-monitor distributing cable testing method of this invention will be described in detail with reference to the accompanying drawings.

Figure 1:
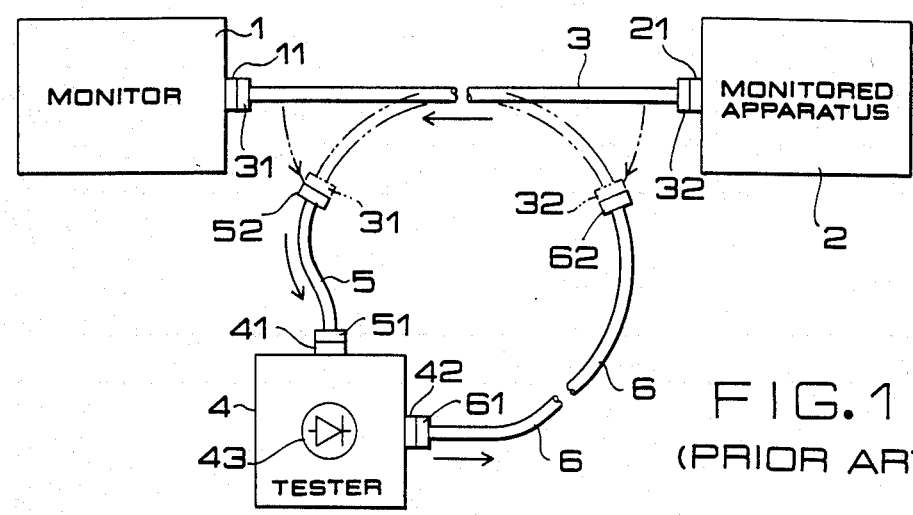
FIG. 1 is a block connection diagram showing how a tester is connected to carry out a conventional method of testing a distributing cable rigged for a train monitor.
Figure 2:
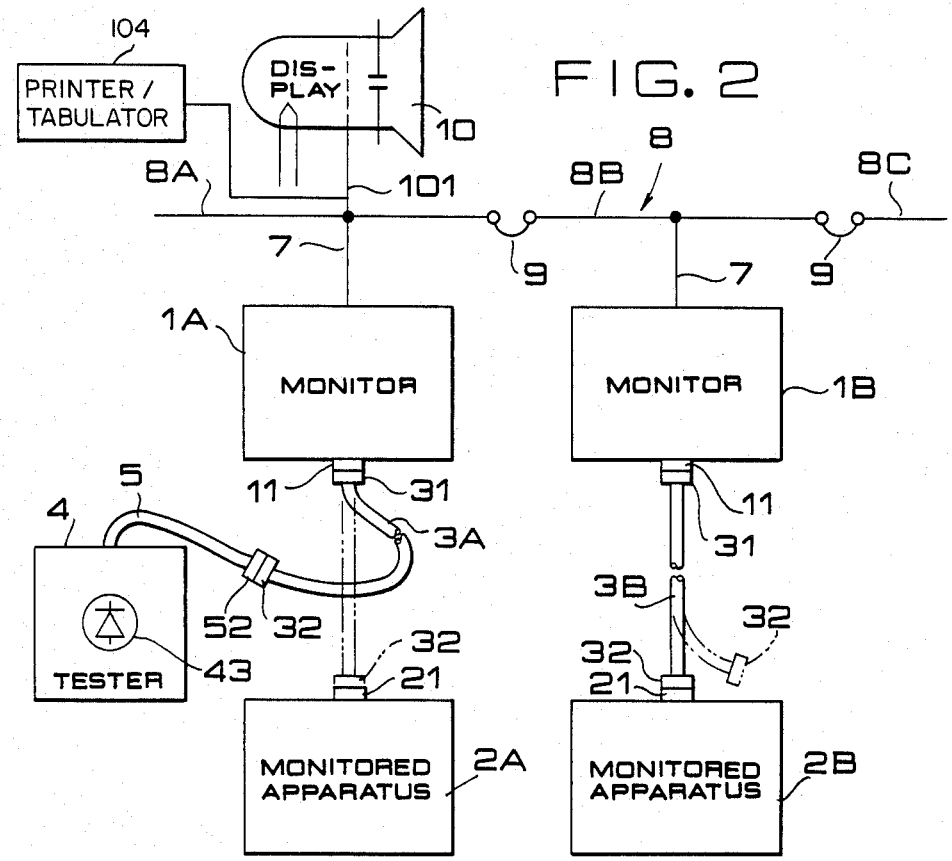
FIG. 2 is a block connection diagram showing how a tester is connected to carry out the method of this invention by an embodiment thereof for testing a distributing cable rigged for a train monitor.

In FIG. 2, monitors 1A, 1B are installed in a plurality of vehicles coupled with one another to constitute a railroad train and are electrically connected to monitored apparatus 2A, 2B in the individual vehicles by distributing cables 3A, 3B which are rigged under the floors of the vehicles or on the ceilings thereof. Connectors 31, 31 are attached to the ends of the cables 3A, 3B adjacent to the monitors and are mated with connectors 11, 11 of the monitors 1A, 1B, while connectors 32, 32 are attached to the other ends of the cables adjacent to the monitored apparatus and are mated with connectors 21, 21 of the monitored apparatus 2A, 2B.

A tester 4 is furnished with a single testing cable 5 and an output display means consisting of a light emitting diode 43 or the like, and a connector 52 is attached to the fore end of the testing cable 5 so as to be mated with the connector 32 of the distributing cables 3A, 3B adjacent to the monitored apparatus 2A, 2B.

The monitors 1A, 1B are connected via junction cables 7 to data transmission cables 8 (8A, 8B and so forth for individual vehicles) which connect the leading vehicle of the train through the trailing vehicle thereof, and such transmission cables 8A, 8B, 8C are electrically connected with one another also in couplers 9, 9 of the vehicles.

A display means such as a cathode-ray tube (hereinafter referred to as CRT) 10 is so disposed as to be connectable via a leadwire 101 to, for example, the cable 8A of the leading vehicle out of the data transmission cables 8.

The rigged distributing cable of each vehicle with such train monitor of the above constitution is tested in the following steps.

First, in any train equipped with a CRT 10 or the like as monitor display means, the CRT 10 is utilized also as display means for testing the distributing cable. However, in case merely an analog meter or the like is furnished as monitor display means in the train, a CRT 10 is connected to the intra-vehicle transmission cable 8A via a leadwire 101.

When testing the distributing cable 3A rigged between the monitor 1A and the monitored apparatus 2A, the connector 32 of the cable 3A adjacent to the monitored apparatus 2A is disconnected therefrom and is mated with the connector 52 at the fore end of the testing cable 5 of the tester 4. FIG. 2 shows how the tester 4 is connected to the distributing cable 3A.

Subsequently a signal equivalent to a normal output electric signal of the monitored apparatus 2A is produced from the tester 4 and is inputted to the distributing cable 3A.

Figure 3:
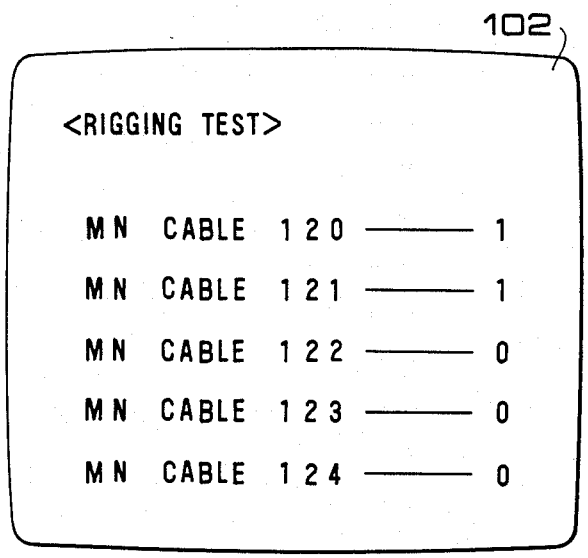
FIGS. 3 and 4 are front views of screens of display means for visibly presenting the test results obtained by the cable testing method of FIG. 2.
Figure 4:
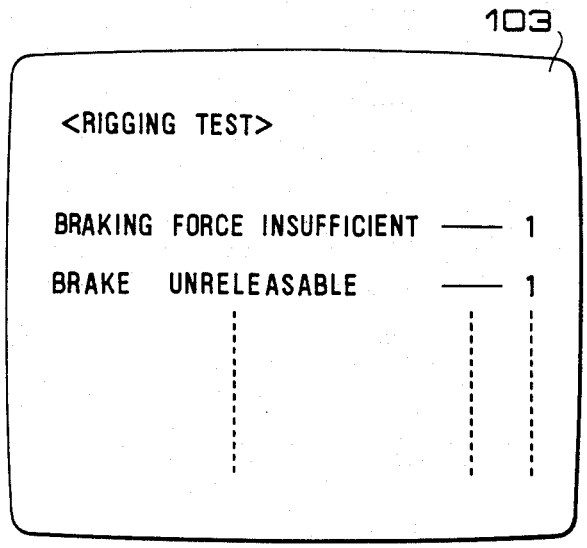

The signal from the tester 4 is fed to the monitor 1A where the distributing cable is judged to be normal or not, and the result is inputted by way of the intra-vehicle transmission cable 7, the data transmission cable 8 and the leadwire 101 to the CRT 10, which displays the test result on the screen 102 as shown in FIGS. 3 and 4. Thus the testing person can confirm whether the distributing cable 3A is normal or not. After completion of testing the distributing cable 3A, the connector 32 of the next distributing cable 3B is mated with the connector 52 to test the cable 3B, and then the entire cable system is tested sequentially in the same manner.

The test result is displayed on the screen 102 or 103 of the CRT 10 with regard to the individual distributing cables as shown in FIGS. 3 and 4. In the example of FIG. 3, the rigged distributing cables 3A, 3B . . . are designated as MN 120, MN 121 . . . respectively, and the result is represented by "1" or "0" on the screen 102. FIG. 4 shows another example where the content of each test is displayed in ordinary words on the screen 103 with "1" or "0" representing the result. In this manner the test result can be displayed visibly with regard to each distributing cable or each test content.

Although not shown, a computer such as a central processing unit may be connected to the display means of CRT 10 or the like so as to conduct each test with a higher precision. Furthermore, a suitable printer/tabulator 104 may be connected to the CRT 10 or the like for printing out the test content displayed on the screen 102 or 103 and thereby tabulating the test result.

According to the present invention, as is obvious from the detailed description given above, a testing signal equivalent to the output signal of a monitored apparatus is outputted from a tester connected to a rigged distributing cable and is fed to a monitor, which then produces a signal corresponding to the state of the distributing cable and feeds such signal to a display means where the test result is displayed on its screen, hence achieving a variety of effects as follows.

First, any long testing cable is rendered unnecessary and the test result can be displayed on an existing or easily installable display means, thereby attaining a reduction in the testing equipment cost.

Furthermore, each test can be conducted merely by operating a tester after coupling it to one conductor of the distributing cable adjacent to the monitored apparatus, hence simplifying the installation of the tester as well as enhancing the testing efficiency.

In addition, the operational reliability can be raised since probable causes that may induce faults in the tester are minimized in relation to nonnecessity of any long testing cable.

What is claimed is:

1. A method of testing electrical continuity, deterioration and so forth of distributing cables rigged for train monitors installed in a plurality of vehicles coupled with one another to constitute a railroad train, said cables serving to electrically connect said monitors with monitored apparatus disposed in said train vehicles, said method comprising:
   a first step of connecting at least one display device in common to said monitors installed in said train vehicles;
   a second step of disconnecting a connector of each distributing cable adjacent to said monitored apparatus and connecting said connector to a tester;
   a third step of feeding from said tester to each of said monitors a testing signal electrically equivalent to the output signal of said monitored apparatus; and
   a fourth step of displaying the information, which corresponds to the state of said distributing cable, on said display means via said monitor.

2. The method as defined in claim 1, wherein said display device in said first step is composed of a cathode-ray tube and is installed in each vehicle of said train.

3. The method as defined in claim 1, wherein said display device connected in said first step and displaying said information thereon in said fourth step is connected to said monitor in the leading vehicle.

4. The method as defined in claim 1, wherein said display device connected in said first step and displaying said information thereon in said fourth step is connected to said monitor in the trailing vehicle.

5. The method as defined in claim 1, wherein one monitor is installed in a single vehicle, while plural kinds of plural monitored apparatus are installed in said single vehicle.

6. The method as defined in claim 1, wherein said monitored apparatus in said third step is a brake, and said testing signal is equivalent to a braking current.

7. The method as defined in claim 1, wherein said monitors installed in said vehicles are connected to a single data transmission cable via which the test result is outputted to said display device.

8. The method as defined in claim 1, wherein said tester for feeding a testing signal in said second and third steps is equipped with an output-state display device composed of a light emitting diode.

9. The method as defined in claim 1, wherein the connection between said distributing cable and said monitored apparatus and said tester consists of mutually joinable connectors.

10. The method as defined in claim 1, wherein the information representing the state of said distributing cable and displayed by said display device in said fourth step is printed and tabulated by a printer/tabulator attached to said display device.

* * * * *